Feb. 1, 1966 J. N. PIKE 3,233,111

SILICON WHISKER PHOTOCELL WITH SHORT RESPONSE TIME

Filed May 31, 1962

INVENTOR.
JOHN N. PIKE
BY [signature]
ATTORNEY 3,233,111
Patented Feb. 1, 1966

3,233,111

SILICON WHISKER PHOTOCELL WITH SHORT RESPONSE TIME

John N. Pike, Lakewood, Ohio, assignor to Union Carbide Corporation, a corporation of New York Filed May 31, 1962, Ser. No. 198,959
3 Claims. (Cl. 250—211)

The present invention relates generally to photocells and, more particularly, to a novel solid state photocell employing silicon as a photo sensitive element and having a relatively short response time.

Photocells are devices which can convert luminous energy into an electrical signal. The photocells that are most common today are of three main types: photoemissive cells, photoconductive cells, and photovoltaic cells. Photoemissive cells are generally vacuum or gas devices whereas photoconductive and photovoltaic cells are solid state devices. In the photoconductive cell, an external voltage is applied; when light is incident, the resistance of the cell changes. In the photovoltaic cell, no external voltage is applied; when light is incident, the cell creates a voltage. In recent years, solid state devices have attracted considerable attention, mainly because of their small size, low power dissipation, ruggedness, and dependability.

Heretofore, a great variety of both solid state and gas or vacuum photocells have been proposed for various applications, and a number of criteria have been used for their evaluation. For detection purposes, one of the most important criteria is the speed of response or response time of the cell. The response time of a photocell is especially important, for example, when it is used to detect the output of a pulsed laser. It has been found that each pulse produced by a laser consists of an irregular series of extremely intense, fast spikes of the characteristic emited light. These spikes are typically separated by about one microsecond, and each spike is generally less than half a microsecond in duration. Estimates of spike rise times as short as $10^{-9}$ seconds have been made. Thus, it is obvious that in order to measure the shape of such spikes, so as to measure the peak power output of the laser, a photodetection system with a response time considerably shorter than one microsecond is required. However, most of the solid state photocells heretofore proposed have not been capable of such short response times. For example, the response times of commercially available germanium solid state photodetectors (diodes, phototransistors, photoconductors) are generally longer than about one microsecond. Silicon photovoltaic cells also have response times in this range. Although vacuum photocells are capable of response times of less than a microsecond, it is generally necessary to reduce the output signal level and, therefore, the sensitivity of such devices in order to attain a high speed of response. Also, as explained above, the vacuum photocells are not as attractive as the solid state photocells for certain applications.

It is, therefore, the main object of the present invention to provide a solid-state photocell capable of a relatively short response time with a high degree of sensitivity.

It is another object of the invention to provide a solid-state photocell that is capable of response times considerably shorter than one microsecond.

It is a further object of the invention to provide a solid-state photocell for monitoring high intensity laser beams and for measuring the shape of the spikes in the output of a pulsed laser.

A still further object is to provide a solid-state photocell that is capable of miniaturization.

Other aims and advantages of the invention will be apparent from the following detailed description of preferred embodiments thereof taken in connection with the accompanying drawings, in which like numerals refer to like parts in the several views, and in which.

Figure 1:
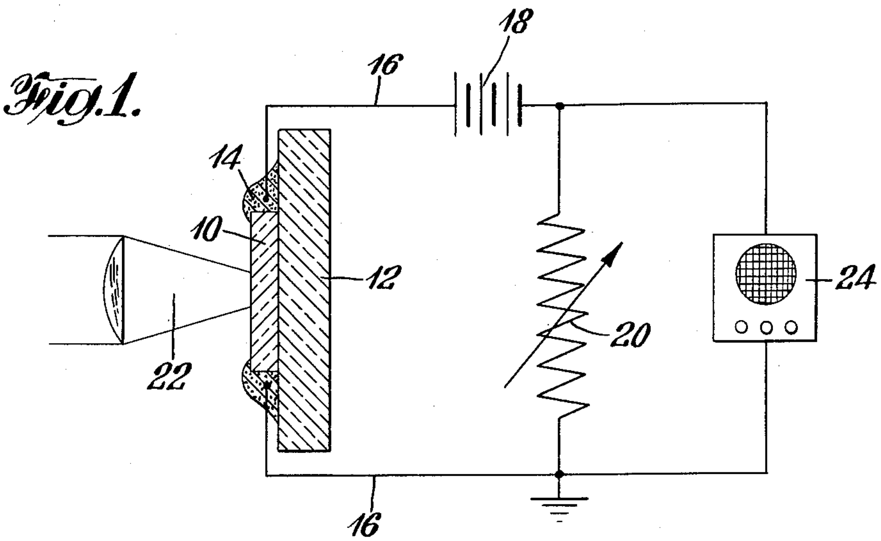
FIG. 1 is a schematic view of the inventive photocell embodied in the photodetector circuit.

In accordance with the present invention, there is provided a solid-state photocell having a silicon whisker as the photosensitive element. As used herein, the term "silicon whisker" refers to silicon in a needle-like form which is conventionally produced by vapor or electrolytic deposition techniques known in the art. The technology of whiskers and methods for their production are described in detail in the literature, particular reference being made to the articles "Metal Whisker" by S. S. Brenner, Scientific America, vol. 203, 1960, and Growth and Perfection of Crystals, Part III, edited by Doremus, Roberts, and Turnbull, John Wiley and Sons, Inc., New York, 1958. For the purposes of the present invention, the silicon whisker should have a relatively small diameter, preferably less than about 50 microns, and a relatively high electrical resistivity, preferably at least 100 ohm centimeters. The length of the silicon whisker is not narrowly critical, and preferred lengths vary somewhat with the different uses. For example, when the photocell is to be used as a laser monitor, whisker lengths between 0.5 and 1.5 millimeters are preferred. The whisker may be monocrystalline or polycrystalline, doped or undoped. It is preferred to use whiskers that have been grown rather than machined, because, for the small diameters desired, machining would be economically impractical.

The inventive photocell may be used as a photodetector by electrically connecting the ends of the silicon whisker in series with a load impedance and a D.C. voltage source and providing means for detecting changes in the voltage drop across the load impedance.

A preferred embodiment of the present invention will now be described in greater detail by referring to the drawings.

Referring to FIG. 1, a silicon whisker 10 is mounted on a glass supporting member 12 by means of two masses 14 of air-dried silver paste at the ends of the whisker 10. The whisker 10 is mounted so that the light beam 22 strikes the surface of the whisker. Electrical conductors 16 embedded in the masses 14 of conductive paste electrically connect the ends of the whisker 10 in series with a D.C. voltage source 18 and a load impedance 20 so that an electrical current flows through the whisker 10 and the load impedance 20. This circuit operates as a conventional photoconductive cell: the resistance of the silicon whisker 10 varies in accordance with variations in the intensity of the light beam 22 striking the surface of the whisker 10, and the changes in resistance induced by the light produce corresponding changes in the magnitude of the current flowing through the load impedance 20.

In order to use the photocell to detect or monitor changes in the intensity of light beam 22, a means for detecting changes in the voltage drop across the load impedance 20, such as an oscilloscope 24, is connected across the impedance 20. Although the angle of incidence of the light beam 22 on the whisker surface is not critical, it is preferred to have the light beam 22 strike the whisker about normal to the axis of the whisker so as to achieve maximum absorption and minimum reflection. At relatively high light intensities, the light beam should be filtered, limited, or defocused so that only a small fraction of the beam strikes the whisker, thereby keeping the photocell output in the linear region and avoiding thermal damage to the whisker and saturation of the photocell. The incident light beam 22 may be any light or radiation within the absorption band of silicon.

In an example of the present invention, the device illustrated in FIG. 1 was used to monitor the ouput of a pulsed ruby laser. The silicon whisker was about 1 mm. long and 33 microns in diameter and was connected in series with a 90-volt battery and a variable load resistor. A D.C.-to-10 mc. oscilloscope was used to detect the voltage drop across the load resistor. With only general room illumination (about 70 footcandles, daylight fluorescent) falling on the whisker, its resistance (whisker plus silver paste contact resistance) was about $10^8$ ohms. When the beam from the pulsed ruby laser, operating just above threshold, was focused on the whisker perpendicularly to the axis of the whisker in a spot about 100 microns in diameter, the resistance of the whisker was significantly decreased. In a typical case, the current through the load resistance increased from about 1 microampere with the room illumination on the whisker to about 300 microamperes with the laser beam on the whisker.

In order to compart the operation of the aforedescribed silicon whisker photocell with a conventional vacuum photocell, two such photocells were operated as laser monitors so as to achieve a response time of 0.2 $\mu$second. The operating conditions for each photocell are shown in the following table:

*Operating conditions for rise time of 0.2 $\mu$second*

| Detector | Applied Voltage, volts | Load $R_L$, ohms | Fraction $f$ of Laser Beam Collected | Signal Voltage, volts | Laser Flash-tube Voltage P (percent above threshold) | Relative Sensitivity $\frac{V}{P^2 R_L f}$ |
|---|---|---|---|---|---|---|
| Si Whisker Cell | 90 | 300 | 0.2 | 0.25 | 1.7 | $1.5\times10^{-3}$ |
| | 90 | 1,000 | 0.2 | 0.60 | 1.7 | $1.1\times10^{-3}$ |
| Vacuum Cell | 250 | 10 | 0.019 | 0.015 | 27.9 | $0.10\times10^{-3}$ |
| | 250 | 100 | 0.019 | 0.10 | 27.9 | $0.07\times10^{-3}$ |

The fraction $f$ of laser beam collected in the vacuum photocell was calculated from the detector geometry and the assumption that flashed opal glass is a Lambertian scatterer. The laser emission intensity is proportional to $P^2$. The response times of the cells were determined by observing the rise time of the spike on the oscilloscope and subtracting therefrom the rise time of the oscilloscope. The relative sensitivity shown in the last column of the table is the normalized photocell output, which is a function of the output signal voltage, the laser power level, and the fraction of the laser beam employed. As can be seen from the table, at the response time of 0.2 microsecond, the whisker cell was about 15 times more sensitive than the vacuum cell. In order to reduce the response time in the vacuum cell still further, it would be necessary to decrease the load resistance, which would further decrease the voltage going to the oscilloscope and, therefore, the relative sensitivity of the cell. Thus, the silicon whisker cell not only possesses all the inherent advantages of a solid state device, but also is capable of achieving short response times with a higher degree of sensitivity than with vacuum photocells.

Figure 2:
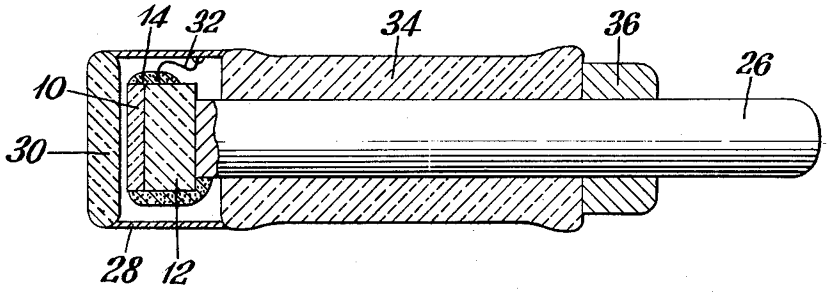
FIG. 2 is a schematic view of the inventive photocell in a conventional miniature tube.
Figure 3:
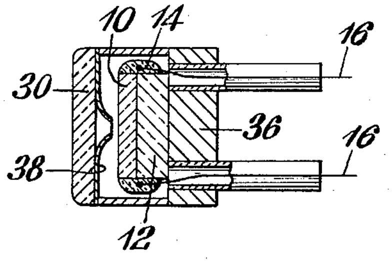
FIG. 3 is a schematic view of the inventive photocell in a miniature tube having an element for limiting the light beam falling on the photosensitive element.

Examples of how the silicon whisker photocell may by encapsulated in miniature tubes are illustrated in FIGS. 2 and 3. In FIG. 2, the silicon whisker 10 is mounted by means of silver paste 14 on an insulating (such as glass) supporting member mounted on a conductive metal rod 26. The whisker 10 is surrounded by a conductive metal collar 28 secured to a glass window 30 which allows a light beam to be focused on the whisker surface. One end of the whisker 10 is electrically connected to the metal rod 26 by a mass of silver paste 14, while the other end of the whisker is electrically connected to the metal collar 28 by a conductor 32 embedded in a mass of silver paste 14. The main body portion of the metal rod 26 is surrounded by a glass sleeve 34 attached to the metal collar 28 and a metal-to-glass seal 36. The D.C. voltage source, load resistance, and oscilloscope, which are not shown, are connected between the metal collar 28 and the metal rod 26.

The tube shown in FIG. 3 is substantially the same as that shown in FIG. 2 with the addition of a plate 38, between the whisker 10 and the glass window 30, having small apertures therein to limit the light beam so that only a part thereof falls on the whisker surface. Also, the electrical leads from the ends of the whisker 10 in FIG. 3 have been reduced in size to further miniaturize the solid state photocell.

While various specific forms of the present invention have been illustrated and described herein, it is not intended to limit the invention to any of the details herein shown.

What is claimed is:

1. A photosensitive device which comprises in combination: a silicon whisker, a D.C. voltage source, a load impedance, and circuit means connecting said whisker, voltage source and load impedance in series; said whisker having a diameter less than about 50 microns and an electrical resistivity of at least 100 ohm centimeters.

2. A photosensitive device for detecting the output of a pulsed laser which comprises in combination: a silicon whisker, a D.C. voltage source, a load impedance, and circuit means connecting said whisker, voltage source and load impedance in series; said whisker having a diameter less than about 50 microns, an electrical resistivity of at least 100 ohm centimeters, and a length of about 0.5 to about 1.5 millimeters.

3. A photodetector which comprises in combination: (A) a silicon whisker, a D.C. voltage source, a load impedance, and circuit means connecting said whisker, voltage source and load impedance in series; said whisker having a diameter less than about 50 microns and an electrical resistivity of at least 100 ohm centimeters; (B) an optical system for directing a beam of light onto said whisker; and (C) means for detecting changes in the voltage drop across said load impedance.

References Cited by the Examiner

UNITED STATES PATENTS

| | | | |
|---|---|---|---|
| 2,847,544 | 8/1950 | Taft et al. | 252—501 X |
| 2,871,330 | 1/1959 | Collins | 252—501 X |
| 2,929,922 | 3/1960 | Schawlow et al. | 250—211 X |
| 2,963,390 | 12/1960 | Dickson | 250—211 X |
| 3,004,168 | 10/1961 | Emeis | 50—211 |
| 3,009,068 | 11/1961 | Raymond | 250—211 XR |
| 3,130,254 | 4/1964 | Sorokin et al. | 331—94.5 |

OTHER REFERENCES

Doremus et al.: Growth and Perfection of Crystals, John Wiley & Sons, Inc., 1958, pages 157–196.

Hannay: Semi-Conductors, Reinhold Publishing Corp., 1959, pages 139–140.

Luft: Electronic Industries, February 1961, pages 102–105.

RALPH G. NILSON, *Primary Examiner.*

WALTER STOLWEIN, *Examiner.*